(12) United States Patent
Kim et al.

(10) Patent No.: US 11,670,831 B2
(45) Date of Patent: Jun. 6, 2023

(54) ULTRA-HIGH FREQUENCY POWER COMBINER AND DIVIDER COMPENSATING FOR PARASITIC PARAMETERS

(71) Applicant: AGENCY FOR DEFENSE DEVELOPMENT, Daejeon (KR)

(72) Inventors: Kichul Kim, Daejeon (KR); Young Dam Kim, Daejeon (KR); Taehwan Joo, Daejeon (KR); Chanho Hwang, Daejeon (KR); Jaesoo Jung, Daejeon (KR); Gilsoo Jung, Daejeon (KR); Daehoon Gwon, Daejeon (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 0 days.

(21) Appl. No.: 17/407,038

(22) Filed: Aug. 19, 2021

(65) Prior Publication Data

US 2022/0158322 A1    May 19, 2022

(30) Foreign Application Priority Data

Nov. 16, 2020   (KR) .................. 10-2020-0153088

(51) Int. Cl.
   *H01P 5/12*    (2006.01)
   *H03F 3/60*    (2006.01)

(52) U.S. Cl.
   CPC ............. *H01P 5/12* (2013.01); *H03F 3/602* (2013.01)

(58) Field of Classification Search
   CPC .................. H01P 5/12; H03F 3/602
   See application file for complete search history.

(56) References Cited

U.S. PATENT DOCUMENTS

| | | | |
|---|---|---|---|
| 5,977,843 A | 11/1999 | Watanabe | |
| 2017/0163237 A1* | 6/2017 | Lee | H03H 7/46 |
| 2019/0214700 A1* | 7/2019 | Wang | H01P 1/36 |

FOREIGN PATENT DOCUMENTS

| | | |
|---|---|---|
| CN | 111193089 | 5/2020 |
| KR | 10-2004-0050747 | 6/2004 |
| KR | 10-0529581 | 11/2005 |
| KR | 10-2011-0020574 | 3/2011 |

OTHER PUBLICATIONS

Office Action dated May 26, 2022 for Korean Patent Application No. 10-2020-0153088 and its English translation provided by the Applicant's foreign counsel.
Office Action dated Nov. 12, 2021 for Korean Patent Application No. 10-2020-0153088 and its English translation by Google Translate.

* cited by examiner

*Primary Examiner* — Daniel C Puentes
(74) *Attorney, Agent, or Firm* — Ladas & Parry, LLP

(57) ABSTRACT

An ultra-high frequency power combiner according to the disclosure includes a first input line connected to a first input port, a second input line connected to a second input port, an output line connected to an output port, a first transmission line between the first input line and the output line, a second transmission line between the second input line and the output line, a first series capacitor, a resistor, and a second series capacitor connected in series between a first node between the first input line and the first transmission line and a second node between the second input line and the second transmission line, and a first parallel capacitor, an inductor, and a second parallel capacitor connected in parallel with the resistor and connected in series with one another.

8 Claims, 14 Drawing Sheets

EVEN MODE

ODD MODE

− RELATED ART −

ULTRA-HIGH FREQUENCY POWER COMBINER AND DIVIDER COMPENSATING FOR PARASITIC PARAMETERS

CROSS-REFERENCE TO RELATED APPLICATION

This application is based on and claims priority under 35 U.S.C. § 119 to Korean Patent Application No. 10-2020-0153088, filed on Nov. 16, 2020, in the Korean Intellectual Property Office, the disclosure of which is incorporated by reference herein in its entirety.

BACKGROUND

1. Field

The disclosure relates to a power combiner and a power divider, and more particularly, to power combiner and divider circuits capable of compensating for parasitic parameters generated by the use of ultra-high frequency in a power combiner structure for generating high output power for use of long-range communication and radar in a high frequency band of several tens of gigahertz (GHz) or more.

2. Description of the Related Art

Long-range communication using high frequency may be performed in order to be able to replace conventional military communications with the related art in a high frequency band of several tens of GHz or more that may be utilized in future communication and future battlefields in addition to a frequency band (a band of several GHz) that is currently and mainly in operation. One of various selectable methods of improving a communication range in such a high frequency band is to increase maximum output power of a power amplifier at a front end module connected to an antenna, and to this end, a power combiner is required to generate the maximum output power in a power amplifier IC.

When a frequency is low enough, there are few parasitic parameters generated by the power combiner, and thus, a decrease in performance of the power combiner due to the parasitic parameters has not been considered, but when a frequency reaches a band of several tens of GHz and a THz band, a large parasitic parameter is generated even in one small connection line, thereby degrading the performance of the power combiner.

The power combiner is a circuit that combines signals, which are input to input ports, together and outputs the combined signals to an output port. The power combiner may also be used as a power divider by switching input/output ports. Representatively, Wilkinson power combiners have been widely used. In the present specification, a power combiner is described. However, it should be noted that the spirit of the disclosure may be equally applied to a power divider in which input/output ports are switched.

FIG. 1 schematically shows a Wilkinson power combiner of the related art. FIG. 2 schematically shows a Wilkinson power combiner operating in a high frequency band.

Referring to FIG. 1, the Wilkinson power combiner of the related art includes a first input port P1, a second input port P2, and an output port P3. Power input to the first input port P1 and power input to the second input port P2 are combined together and output to the output port P3.

The first input port P1 is connected to a first node A via a first input line IL1, the second input port P2 is connected to a second node B via a second input line IL2, and the output port P3 is connected to a third node C via an output line OL. A first transmission line TL1 is connected between the first node A and the third node C, and a second transmission line TL2 is connected between the second node B and the third node C. The first input line IL1, the second input line IL2, and the output line OL have characteristic impedance of $Z_0$, and the first and second transmission lines TL1 and TL2 have characteristic impedance of $\sqrt{2}Z_0$. When a wavelength of an operating frequency is $\lambda$, the first and second transmission lines TL1 and TL2 may have a length of $\lambda/4$. A width and length of the first and second transmission lines TL1 and TL2 may be determined according to an operating frequency and a stacked structure.

For matching at each of the first and second input ports P1 and P2 and the output port P3, a resistor of 100Ω may be connected between the first node A and the second node B. When the Wilkinson power combiner operates in a low frequency band, a resistance component close to 100Ω is seen between the first node A and the second node B. Terminal impedances $Z_0$ of the first and second input ports P1 and P2 are seen to be respectively converted into $2Z_0$ at the output port P3 by the first and second transmission lines TL1 and TL2. Therefore, because two impedances $2Z_0$ are seen to be connected in parallel at the output port P3, impedance matching at the output port P3 is performed.

Because the first node A and the second node B have the same potential, no current flows through the resistance of 100Ω, and the resistance of 100Ω may not affect input and output. Therefore, the impedance matching is also performed at each of the first and second input ports P1 and P2. In the Wilkinson power combiner, the impedance matching is achieved at all ports, that is, the first and second input ports P1 and P2 and the output port P3, the first and second input ports P1 and P2 are isolated from each other, and power input from the first and second input ports P1 and P2 is output to the output port P3 without loss. The Wilkinson power combiner has a simple configuration, may be easily implemented using a transmission line, and has excellent power distribution efficiency and excellent isolation, and thus, is used in various fields.

However, in a band of several tens of GHz or a band of several hundreds of GHz (a THz band), as shown in FIG. 2, for example, a series inductance component Lpr and a parallel capacitance component Cpr are generated as parasitic parameters in connection lines Wa and Wb connecting the resistor of 100Ω between the first node A and the second node B, and an impedance component other than 100Ω is also seen between the first node A and the second node B. Due to the impedance component, the performance of the Wilkinson power combiner is degraded in a high frequency band.

SUMMARY

Provided are an ultra-high frequency power combiner and divider compensating for parasitic parameters to improve performance in a high frequency band.

Additional aspects will be set forth in part in the description which follows and, in part, will be apparent from the description, or may be learned by practice of the presented embodiments of the disclosure.

An ultra-high frequency power combiner according to an aspect of the disclosure includes a first input line connected to a first input port, a second input line connected to a second input port, an output line connected to an output port, a first transmission line between the first input line and the output line, a second transmission line between the second input line and the output line, a first series capacitor, a resistor, and a second series capacitor connected in series between a first node between the first input line and the first transmission line and a second node between the second input line and the second transmission line, and a first parallel capacitor, an inductor, and a second parallel capacitor connected in parallel with the resistor and connected in series with one another.

According to an embodiment, the resistor may be 38Ω.

According to another embodiment, the first and second series capacitors may each be 0.02 pF, the first and second parallel capacitors may each be 0.03 pF, the inductor may be 0.04 nH, and an operating frequency may be 80 GHz.

According to another embodiment, the ultra-high frequency power combiner may further include a first metal strip including at least a portion overlapping with the first node and connected with the resistor, a second metal strip including at least a portion overlapping with the second node and connected with the resistor, a third metal strip including a first portion overlapping with the first metal strip and a second portion overlapping with the second metal strip and having an inductance of the inductor, and an insulating layer arranged between the first and second metal strips and the third metal strip.

According to another embodiment, the ultra-high frequency power combiner may further include an insulating layer arranged between the first and second nodes and the first and second metal strips.

An ultra-high frequency power divider according to an aspect of the disclosure includes an input line connected to an input port, a first output line connected to a first output port, a second output line connected to a second output port, a first transmission line between the input line and the first output line, a second transmission line between the input line and the second output line, a first series capacitor, a resistor, and a second series capacitor connected in series between a first node between the first transmission line and the first output line and a second node between the second transmission line and the second output line, and a first parallel capacitor, an inductor, and a second parallel capacitor connected in parallel with the resistor and connected in series with one another.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
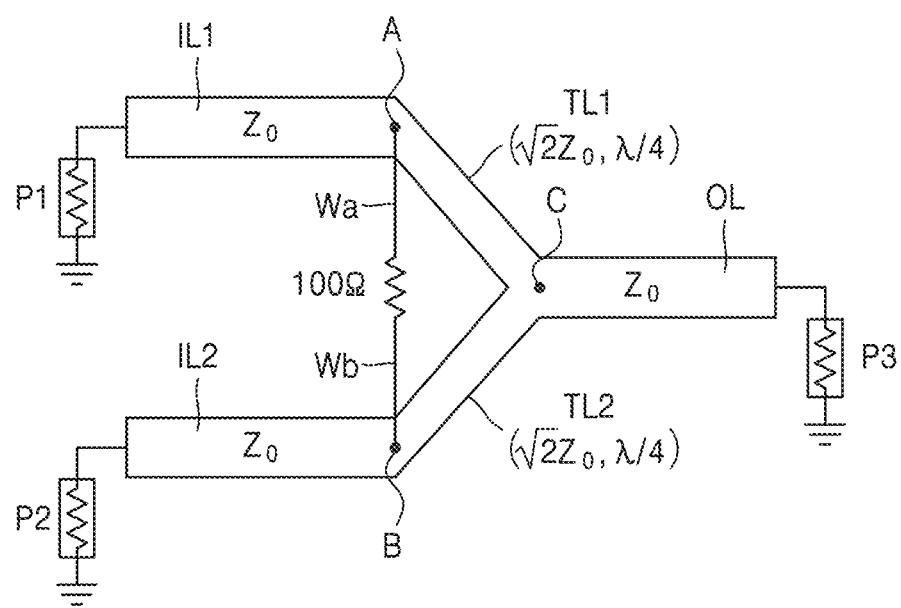
FIG. 1 schematically shows a Wilkinson power combiner of the related art.
Figure 2:
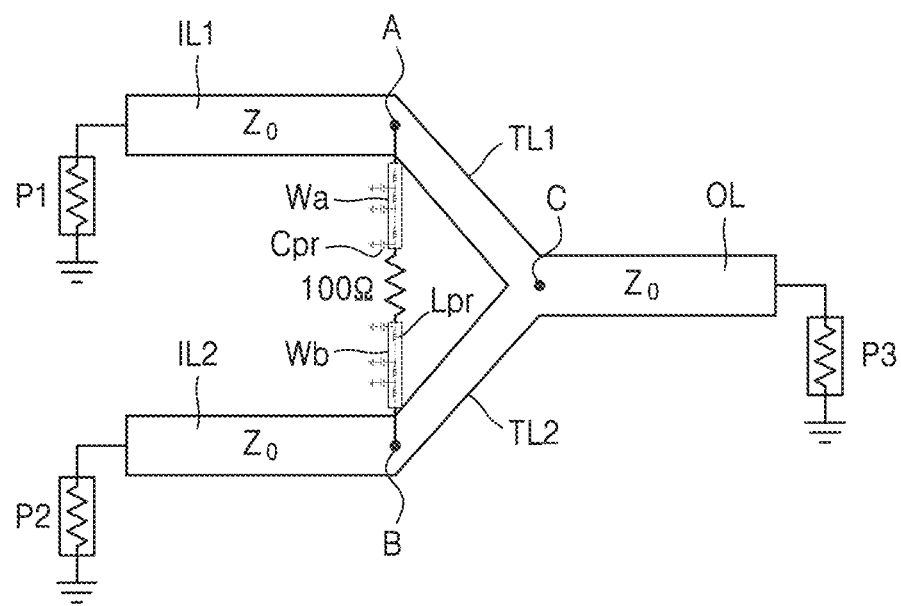
FIG. 2 schematically shows a Wilkinson power combiner operating in a high frequency band.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, various embodiments are described in detail with reference to the accompanying drawings so that this disclosure may be easily performed by one of ordinary skill in the art to which the disclosure pertains. However, since the technical spirit of the disclosure may be modified and implemented in various forms, the disclosure is not limited to the embodiments described in the present specification. In the description of the embodiments disclosed in the present specification, when it is determined that a detailed description of a related known technology may obscure the gist of the technical spirit of the disclosure, the detailed description of the known technology is omitted. The same or similar constituent elements are given the same reference numerals, and overlapping descriptions thereof are omitted.

In the present specification, when an element is referred to as being "connected" or "coupled" to another element, it may be directly connected or coupled to the other element, or may be indirectly connected or coupled to the other element with intervening elements interposed therebetween. When an element "includes" or "comprises" an element, unless there is a particular description contrary thereto, the element may further include other elements, not excluding the other elements.

Some embodiments may be described in terms of functional block components and various processing steps. Some or all of such functional blocks may be implemented by any number of hardware and/or software components configured to perform the specified functions. For example, functional blocks of the disclosure may be implemented by one or more microprocessors or by circuit components for certain functions. The functional blocks of the disclosure may be implemented with any programming or scripting language. The functional blocks of the disclosure may be implemented in algorithms that are executed on one or more processors. Functions performed by the functional blocks of the disclosure may be performed by a plurality of functional blocks, or functions performed by the plurality of functional blocks of the disclosure may be performed by one functional block. Also, the disclosure may employ techniques of the related art for electronics configuration, signal processing, and/or data processing and the like.

Figure 3:
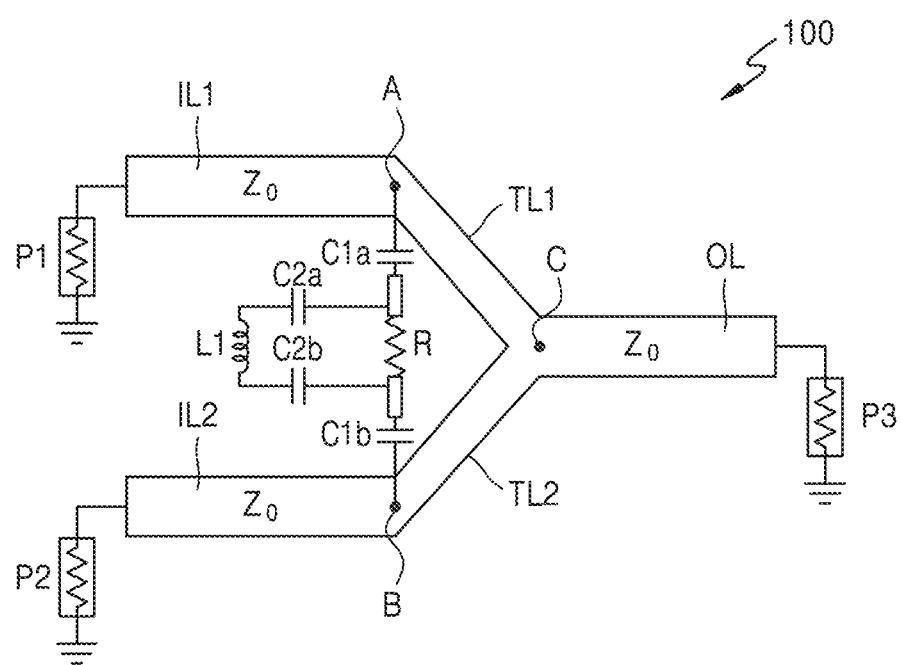
FIG. 3 shows an ultra-high frequency power combiner according to an embodiment of the disclosure.

FIG. 3 shows an ultra-high frequency power combiner according to an embodiment of the disclosure.

Referring to FIG. 3, an ultra-high frequency power combiner 100 (also referred to as a "power combiner 100") includes a first input port P1, a second input port P2, and an output port P3. The ultra-high frequency power combiner 100 is designed to operate in an ultra-high frequency band, and may output, to the output port P3, power obtained by combining power input to the first input port P1 and power input to the second input port P2 together.

The ultra-high frequency power combiner 100 includes a first input line IL1 connected to the first input port P1, a first transmission line TL1 extending from the first input line IL1, a second input line IL2 connected to the second input port P2, a second transmission line TL2 extending from the second input line IL2, and an output line OL T-junction coupled to the first and second transmission lines TL1 and TL2 and connected to the output port P3. The first transmission line TL1 is connected between the first input line IL1 and the output line OL, and the second transmission line TL2 is connected between the second input line IL2 and the output line OL.

In the present specification, a node between the first input line IL1 and the first transmission line TL1 is referred to as a first node A, a node between the second input line IL2 and the second transmission line TL2 is referred to as a second node B, and a node to which the first and second transmission lines TL1 and TL2 and the output port P3 are T-junction coupled is referred to as a third node C.

The ultra-high frequency power combiner 100 includes a first series capacitor C1a, a resistor R, and a second series capacitor C1b connected in series between the first node A and the second node B. The first series capacitor C1a may be connected between the first node A and the resistor R, and the second series capacitor C1b may be connected between the second node B and the resistor R.

In a Wilkinson power combiner of the related art, a resistance of 100Ω is connected between the first node A and the second node B. In a low frequency band, a resistance component of 100Ω is seen between the first node A and the second node B, but in a high frequency band, other impedance components than 100Ω are also seen. In order to reduce parasitic parameters in the high frequency band, the first series capacitor C1a and the second series capacitor C1b may be connected to both ends of the resistor R. The first series capacitor C1a and the second series capacitor C1b may reduce the effects of the parasitic parameters in the high frequency band.

Meanwhile, the resistance of the resistor R may be 38Ω less than 100Ω which is generally used in the related art. The resistor R of 38Ω is connected between the first node A and the second node B in a high frequency band (for example, an operating frequency of 80 GHz), and thus, impedances may be perfectly matched at each of the first and second input ports P1 and P2 and the output port P3. In the operating frequency of 80 GHz, when the resistor R is 38Ω, an impedance seen to a resistance end may be 100Ω.

In a high frequency band (for example, an operating frequency of 80 GHz), the first series capacitor C1a and the second series capacitor C1b may each be 0.02 pF. Capacitance values of the first series capacitor C1a and the second series capacitor C1b may vary according to a parasitic inductance value. An inductive impedance component (jwL) increased by an inductive parasitic parameter (L) may be compensated by capacitive impedance components (1/jwC) of the first series capacitor C1a and the second series capacitor C1b. A desired impedance may be obtained by compensating for an inductive impedance component by a capacitive impedance component. Also, by allowing resonance to occur at an operating frequency between the inductive parasitic parameter (L) and the first series capacitor C1a and the second series capacitor C1b, an impedance seen to a resistance end at the operating frequency band may be reduced.

The ultra-high frequency power combiner 100 includes a first parallel capacitor C2a, an inductor L1, and a second parallel capacitor C2b connected in series with one another. The first parallel capacitor C2a, the inductor L1, and the second parallel capacitor C2b are connected in parallel with the resistor R. Because the first parallel capacitor C2a, the inductor L1, and the second parallel capacitor C2b are connected in parallel with the resistor R, a degree of isolation between the first and second input ports P1 and P2 may be improved.

In the operating frequency of 80 GHz, the first and second parallel capacitors C2a and C2b may each be 0.03 pF, and the inductor L1 may be 0.04 nH.

FIG. 3 shows the ultra-high frequency power combiner according to an embodiment of the disclosure, but the idea of the disclosure may also be equally applied to a power divider in which an input port and an output port are switched. Referring to FIG. 3, an ultra-high frequency power divider according to an embodiment of the disclosure includes an input line OL connected to an input port P3, a first output line IL1 connected to a first output port P1, a second output line IL2 connected to a second output port P2, a first transmission line TL1 between the input line OL and the first output line IL1, and a second transmission line TL2 between the input line OL and the second output line IL2. A node between the first transmission line TL1 and the first output line IL1 is referred to as a first node A, and a node between the second transmission line TL2 and the second output line IL2 is referred to as a second node B.

The ultra-high frequency power divider according to an embodiment of the disclosure includes a first series capacitor C1a, a resistor R, and a second series capacitor C1b connected in series between the first node A and the second node B. The ultra-high frequency power divider according to an embodiment of the disclosure includes a first parallel capacitor C2a, an inductor L1, and a second parallel capacitor C2b connected in series with one another. The first parallel capacitor C2a, the inductor L1, and the second parallel capacitor C2b are connected in parallel with the resistor R.

Figure 4:
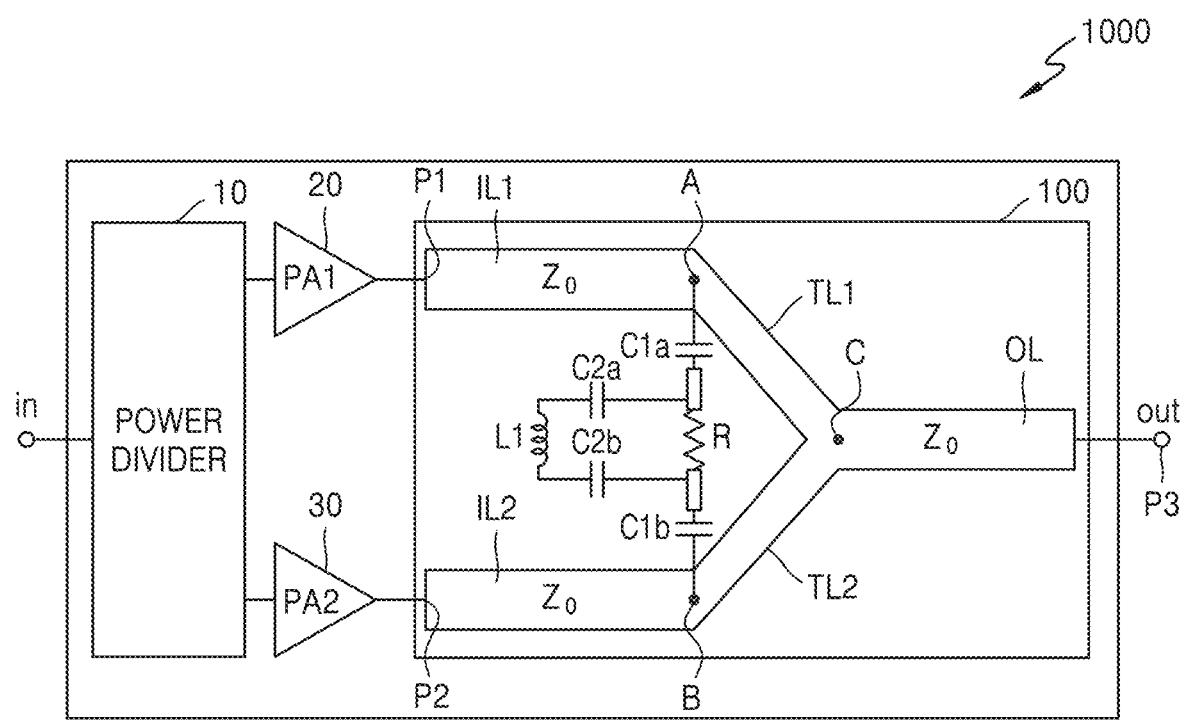
FIG. 4 shows an application example of an ultra-high frequency power combiner according to an embodiment of the disclosure.

FIG. 4 shows an application example of an ultra-high frequency power combiner according to an embodiment of the disclosure.

Referring to FIG. 4, a system 1000 may include a power divider 10, a first power amplifier 20, a second power amplifier 30, and the power combiner 100. Power received through an input terminal in may be distributed at a preset ratio by the power divider 10. The power distributed by the power divider 10 is amplified by the first power amplifier 20 and the second power amplifier 30, respectively, to be input to the first input port P1 and the second input port P2 of the power combiner 100, respectively. The power combiner 100 may substantially correspond to, for example, the power combiner 100 shown in FIG. 3. The power combiner 100 may combine the power received by the first input port P1 and the second input port P2, and then output the combined power to the output port P3, that is, an output terminal out.

The power combiner 100 of the disclosure further includes the first series capacitor C1a, the resistor R, and the second series capacitor C1b connected in series between the first node A and the second node B, and the first parallel capacitor C2a, the inductor L1, and the second parallel capacitor C2b connected in parallel with the resistor R and connected in series with each other, and thus, a degree of isolation between the first power amplifier 20 and the second power amplifier 30 may increase and insertion loss may decrease. This may contribute to improving the performance of a power amplifier IC. Because the insertion loss decreases, maximum output power of the power amplifier IC may increase, and the effects between the first and second power amplifiers 20 and 30 simultaneously decrease due to an increase in the degree of isolation, and thus, a stable power amplifier IC may be designed. As such, the performance of the power amplifier IC itself is improved, thereby enabling a significant contribution to improvement in system performance in various areas such as a communication area or a radar area in which the power amplifier IC may be utilized.

Hereinafter, a result of analyzing the effects of a decrease in parasitic parameters in the ultra-high frequency power combiner according to an embodiment of the disclosure is described. An even mode impedance and an odd mode impedance of the ultra-high frequency power combiner according to the disclosure is analyzed, and a difference from the Wilkinson power combiner of the related art is analyzed. A degree of improvement in performance of the ultra-high frequency power combiner according to the disclosure is analyzed through a degree of improvement in performance relative to the Wilkinson power combiner of the related art and a directional impedance component seen to a resistance end. The Wilkinson power combiner of the related art is considered to have a resistance of 100Ω connected between the first node A and the second node B through a connection line.

Figure 5:
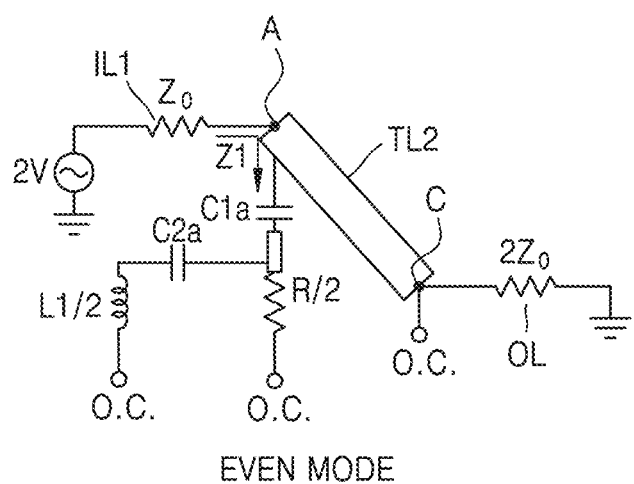
FIG. 5 shows a structure for analyzing an even mode of an ultra-high frequency power combiner according to an embodiment of the disclosure.

FIG. 5 shows a structure for analyzing an even mode of an ultra-high frequency power combiner according to an embodiment of the disclosure.

Referring to FIG. 5, in the analysis of the even mode of the ultra-high frequency power combiner according to an embodiment of the disclosure, a position of an impedance Z1 seen to an actual resistance end is shown. The ultra-high frequency power combiner according to an embodiment of the disclosure is vertically symmetrical, and thus, in the even mode analysis, it may be considered that vertically symmetrical middle nodes are open.

Figure 6:
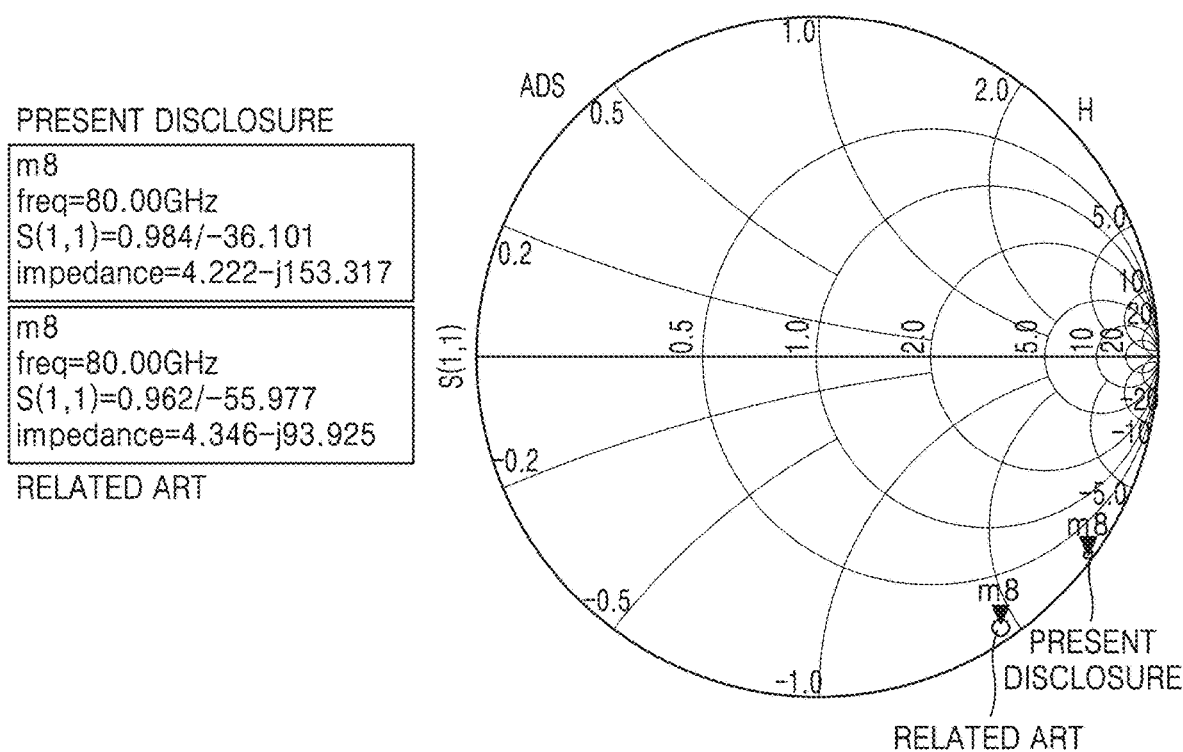
FIG. 6 is a Smith chart showing a difference between a value of an impedance of an ultra-high frequency power combiner according to an embodiment of the disclosure and a value of an impedance of a Wilkinson power combiner of the related art.

FIG. 6 is a Smith chart showing a difference between a value of an impedance Z1 of an ultra-high frequency power combiner according to an embodiment of the disclosure and a value of an impedance Z1 of a Wilkinson power combiner of the related art.

In an ideal Wilkinson power combiner, the impedance Z1 is required to be perfectly open. However, the impedance Z1 is 4.2−j*153.3 due to the connection line between the first node A and the second node B in the Wilkinson power combiner of the related art, and the impedance Z1 is 4.3−j*93.9 in the ultra-high frequency power combiner according to an embodiment of the disclosure. A shown in the Smith chart of FIG. 6, it is confirmed that the impedance Z1 of the ultra-high frequency power combiner according to an embodiment of the disclosure has a value closer to a perfect open than that of the Wilkinson power combiner of the related art.

Figure 7:
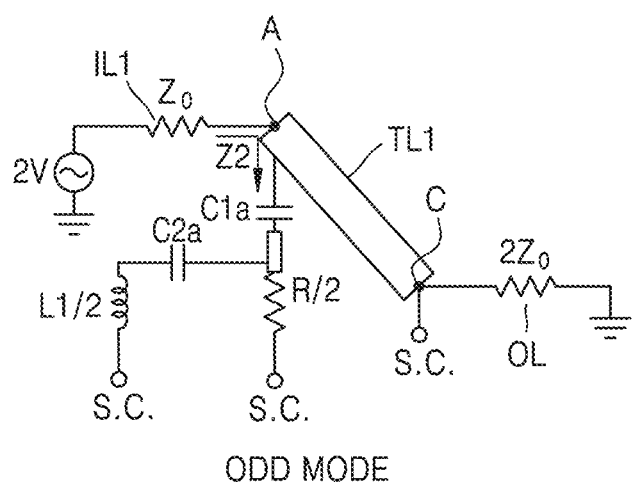
FIG. 7 shows a structure for analyzing an odd mode of an ultra-high frequency power combiner according to an embodiment of the disclosure.

FIG. 7 shows a structure for analyzing an odd mode of an ultra-high frequency power combiner according to an embodiment of the disclosure.

Referring to FIG. 5, in the analysis of the odd mode of the ultra-high frequency power combiner according to an embodiment of the disclosure, a position of an impedance Z2 seen to an actual resistance end is shown. The ultra-high frequency power combiner according to an embodiment of the disclosure is vertically symmetrical, and thus, in the odd mode analysis, it may be considered that vertically symmetrical middle nodes are shorted.

Figure 8:
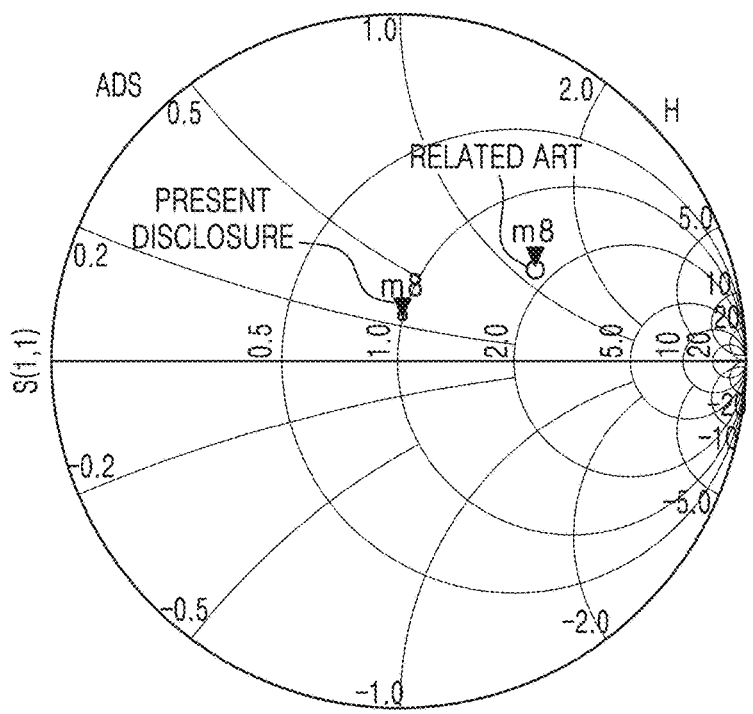
FIG. 8 is a Smith chart showing a difference between a value of an impedance of an ultra-high frequency power combiner according to an embodiment of the disclosure and a value of an impedance of a Wilkinson power combiner of the related art.

FIG. 8 is a Smith chart showing a difference between a value of an impedance Z2 of an ultra-high frequency power combiner according to an embodiment of the disclosure and a value of an impedance Z2 of a Wilkinson power combiner of the related art.

In the ideal Wilkinson power combiner, the impedance Z2 is required to be 50Ω. However, the impedance Z2 is 84.9+j*61.2 due to the connection line between the first node A and the second node B in the Wilkinson power combiner of the related art, and the impedance Z2 is 50.2+j*13.9 in the ultra-high frequency power combiner according to an embodiment of the disclosure. A shown in the Smith chart of FIG. 8, it is confirmed that the impedance Z2 of the ultra-high frequency power combiner according to an embodiment of the disclosure has a value closer to an ideal value (i.e., 50Ω) than that of the Wilkinson power combiner of the related art.

Figure 9:
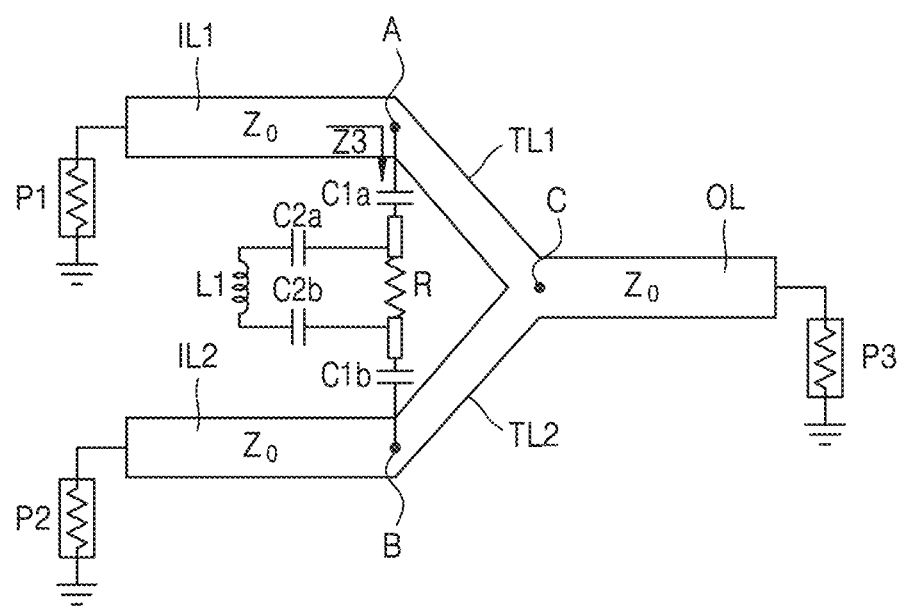
FIG. 9 shows a direction of an impedance seen to an actual resistance end in an ultra-high frequency power combiner according to an embodiment of the disclosure.

FIG. 9 shows a direction of an impedance Z3 seen to an actual resistance end in an ultra-high frequency power combiner according to an embodiment of the disclosure.

Figure 10:
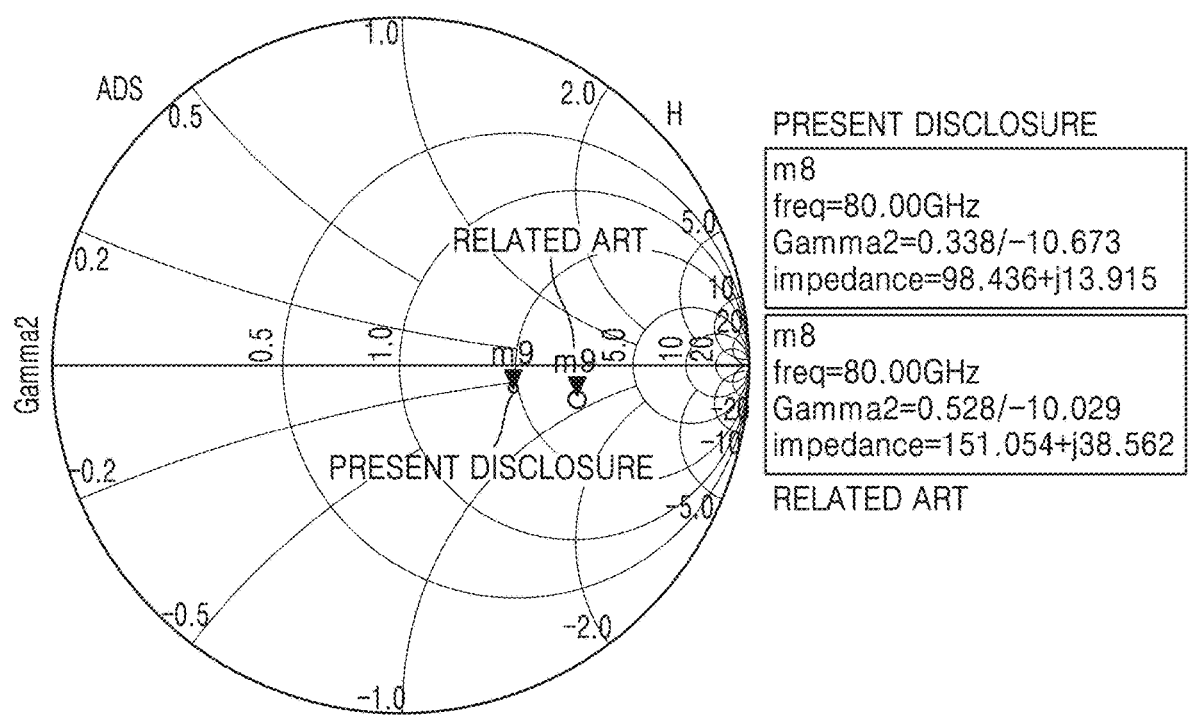
FIG. 10 is a Smith chart showing a difference between a value of an impedance of an ultra-high frequency power combiner according to an embodiment of the disclosure and a value of an impedance of a Wilkinson power combiner of the related art.

FIG. 10 is a Smith chart showing a difference between a value of an impedance Z3 of an ultra-high frequency power combiner according to an embodiment of the disclosure and a value of an impedance Z3 of a Wilkinson power combiner of the related art.

In the ideal Wilkinson power combiner, the impedance Z3 is required to be 100Ω. However, the impedance Z3 is 151−j*38.6 due to the connection line between the first node A and the second node B in the Wilkinson power combiner of the related art, and the impedance Z3 is 98.4−j*13.9 in the ultra-high frequency power combiner according to an embodiment of the disclosure. As shown in the Smith chart of FIG. 10, it is confirmed that the impedance Z3 of the ultra-high frequency power combiner according to an embodiment of the disclosure has a value closer to an ideal value (i.e., 100Ω) than that of the Wilkinson power combiner of the related art.

Figure 11:
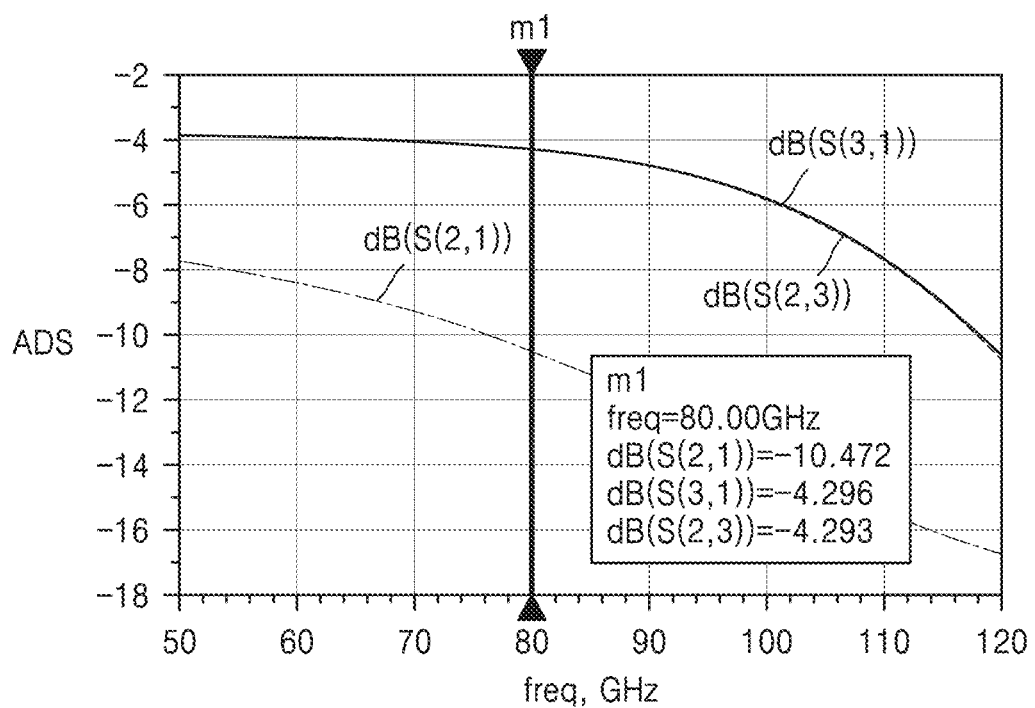
FIG. 11 is a graph showing a simulation characteristics of a Wilkinson power combiner of the related art.
Figure 12:
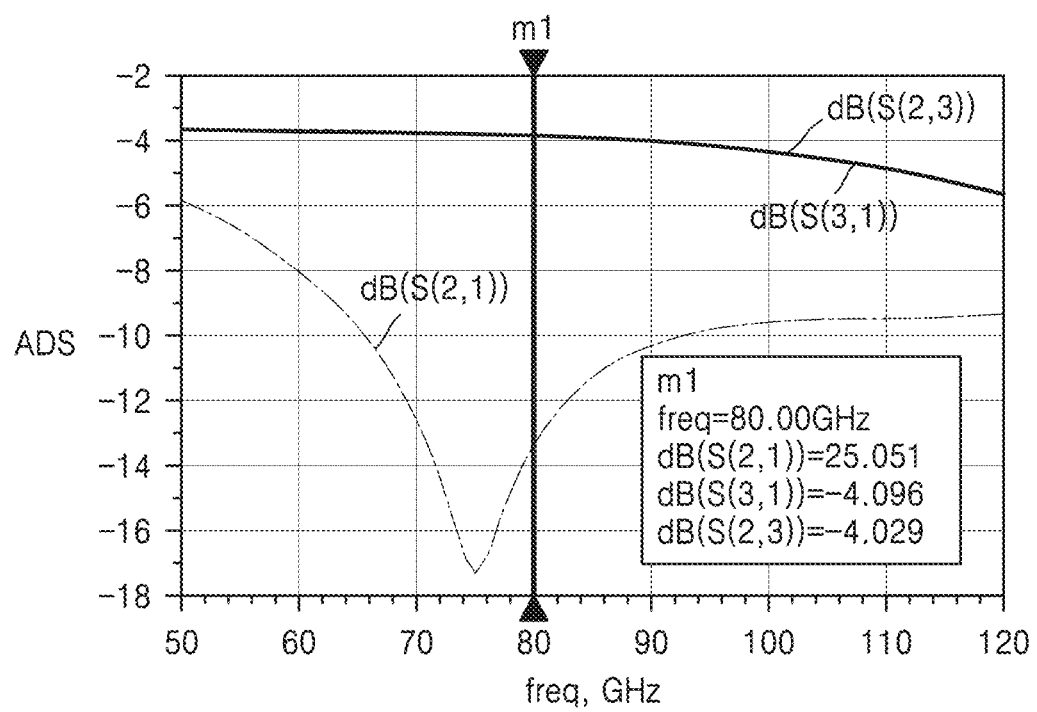
FIG. 12 is a graph showing a simulation characteristic of an ultra-high frequency power combiner according to an embodiment of the disclosure.

FIG. 11 is a graph showing a simulation characteristic of a Wilkinson power combiner of the related art, and FIG. 12 is a graph showing a simulation characteristic of an ultra-high frequency power combiner according to an embodiment of the disclosure.

In the case of the Wilkinson power combiner of the related art, insertion loss is approximately 4.3 dB, and a degree of isolation between the first input port P1 and the second input port P2 is about 10.47 dB.

In contrast, in the case of the ultra-high frequency power combiner according to an embodiment of the disclosure, insertion loss is approximately 4.096 dB, and a degree of isolation between the first input port P1 and the second input port P2 is about 25.05 dB.

Therefore, the ultra-high frequency power combiner according to an embodiment of the disclosure has insertion loss decreased compared to the Wilkinson power combiner of the related art, and has the degree of isolation between the first input port P1 and the second input port P2 increased compared thereto, and thus, it is confirmed that both the insertion loss and the degree of isolation improved.

Figure 13:
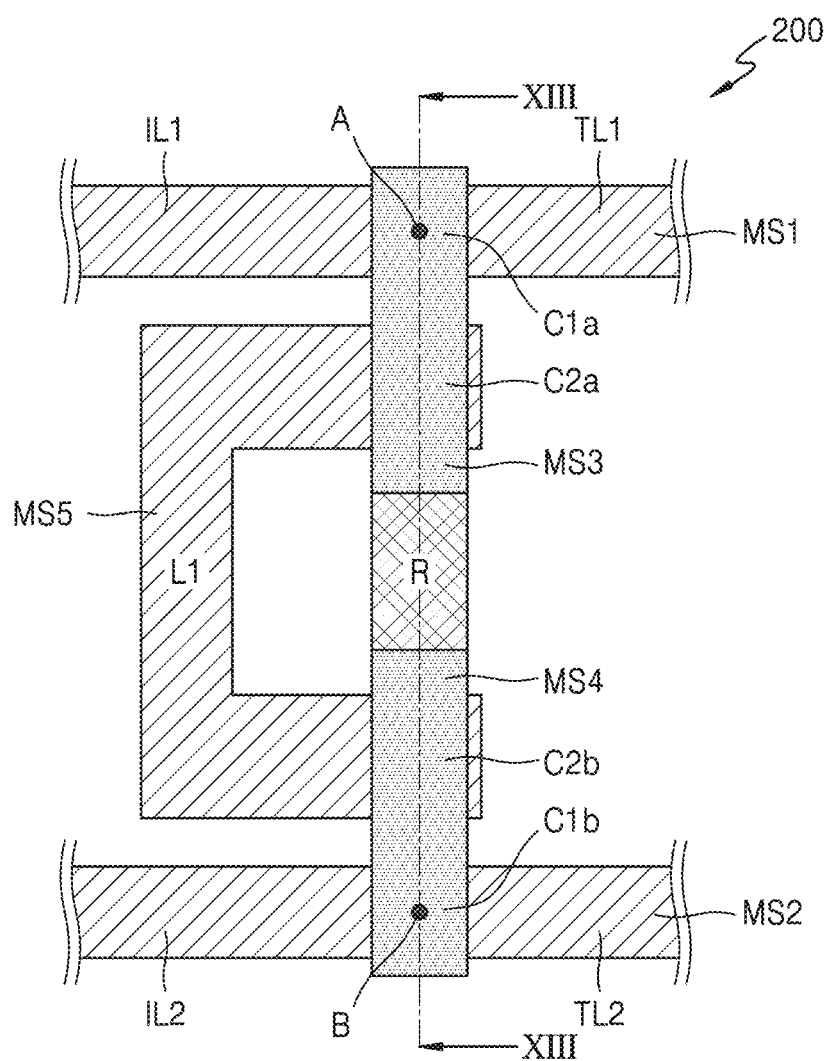
FIG. 13 is a plan view showing a portion of an ultra-high frequency power combiner according to an embodiment of the disclosure.
Figure 14:
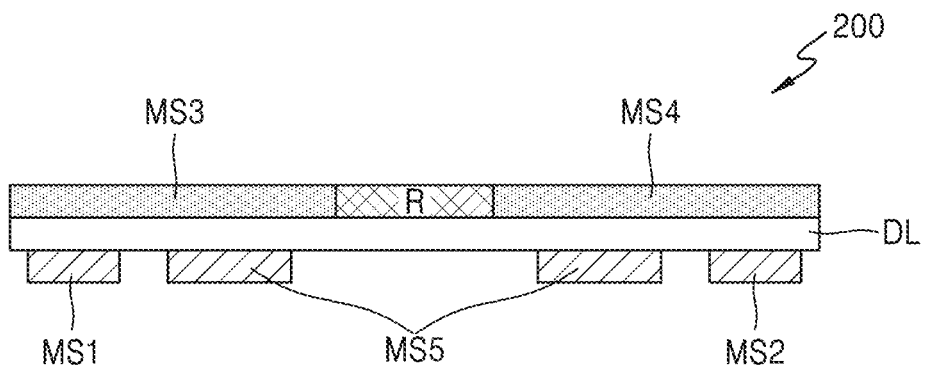
FIG. 14 is a cross-sectional view of an ultra-high frequency power combiner according to an embodiment of the disclosure.

FIG. 13 is a plan view showing a portion of an ultra-high frequency power combiner according to an embodiment of the disclosure. FIG. 14 is a cross-sectional view of an ultra-high frequency power combiner according to an embodiment of the disclosure.

Referring to FIGS. 13 and 14, an ultra-high frequency power combiner 200 includes a first metal strip MS1, a second metal strip MS2, a third metal strip MS3, a fourth metal strip MS4, a fifth metal strip MS5, a resistor R, and an insulating layer DL. The first, second, and fifth metal strips MS1, MS2, and MS5 may be arranged on a first surface of the insulating layer DL, and the third and fourth metal strips MS3 and MS4 may be arranged on a second surface of the insulating layer DL. With respect to the insulating layer DL, the first, second, and fifth metal strips MS1, MS2, and MS5 may be arranged on a first layer, and the third and fourth metal strips MS3 and MS4 may be arranged on a second layer.

As described above, the ultra-high frequency power combiner 200 includes a first input line IL1, a second input line IL2, an output line OL, a first transmission line TL1, and a second transmission line TL2. The first input line IL1 and the first transmission line TL1 may include the first metal strip MS1, and the second input line IL2 and the second transmission line TL2 may include the second metal strip MS2. According to another example, the first and second input lines IL1 and IL2, the output line OL, and the first and second transmission lines TL1 and TL2 may include a single metal strip, and the first and second metal strips MS1 and MS2 may be portions of the single metal strip.

The ultra-high frequency power combiner 200 includes a first series capacitor C1a, the resistor R, and a second series capacitor C1b connected in series between a first node A and a second node B, and a first parallel capacitor C2a, an inductor L1, and a second parallel capacitor C2b connected in parallel with the resistor R and connected in series with one another. The resistor R may be arranged between the third metal strip MS3 and the fourth metal strip MS4. The resistor R may be formed by thinly stacking a resistive material between the third metal strip MS3 and the fourth metal strip MS4.

The third metal strip MS3 includes at least a portion overlapping with a portion corresponding to the first node A of the first metal strip MS1, and the third metal strip MS3 and the first metal strip MS1, which overlap with each other, may constitute the first series capacitor C1a. A capacitance of the first series capacitor C1a may be determined according to an area in which the third metal strip MS3 and the first metal strip MS1 overlap with each other and a thickness and dielectric constant of the insulating layer DL.

The fourth metal strip MS4 includes at least a portion overlapping with a portion corresponding to the second node B of the second metal strip MS2, and the fourth metal strip MS4 and the second metal strip MS2, which overlap with each other, may constitute the second series capacitor C1b. A capacitance of the second series capacitor C1b may be determined according to an area in which the fourth metal strip MS4 and the second metal strip MS2 overlap with each other and a thickness and dielectric constant of the insulating layer DL.

The fifth metal strip MS5 overlap with each of the third metal strip MS3 and the fourth metal strip MS4. The fifth metal strip MS5 may include a first portion overlapping with the third metal strip MS3 and a second portion overlapping with the fourth metal strip MS4. The first portion may constitute the first parallel capacitor C2a, and the second portion may constitute the second parallel capacitor C2b.

The fifth metal strip MS5 includes an inductive component. Because an inductance of the inductor L1 is only about 0.04 nH, the inductor L1 may include the inductive component of the fifth metal strip MS5.

In another embodiment, the first, second metal strips MS1, MS2, and the fifth metal strips MS5 may be arranged on different layers. The fifth metal strip MS5 may be arranged on the third and fourth metal strips MS3 and MS4, and an additional insulating layer may be further arranged between the fifth metal strip MS5 and the third and fourth metal strips MS3 and MS4.

The ultra-high frequency power combiner according to an embodiment of the disclosure may be manufactured utilizing a two-layer line or a multi-layer line. Such a multi-layer structure is utilized in a monolithic microwave integrated circuit (MMIC) chip, and thus, the ultra-high frequency power combiner according to an embodiment of the disclosure may be implemented in the MMIC chip.

In a structure of the Wilkinson power combiner of the related art, a resistance of 100Ω is connected between the first node A and the second node B through the connection lines, and due to parasitic parameters of the connection line, the performance of the power combiner is degraded in a high frequency band. However, compared to the Wilkinson power combiner of the related art, the ultra-high frequency power combiner of the disclosure is invented based on the even mode and the odd mode analysis, parasitic parameters may be offset by adjusting a resistance value of a resistor and connecting series capacitors to the resistor in series, and insertion loss may decrease and a degree of isolation may increase, by connecting parallel capacitors and an inductor to the resistor in parallel.

By improving the performance of the ultra-high frequency power combiner, maximum output power of a power amplifier may increase, and thus, the performance (e.g., a maximum communication range, a maximum radar detection range, or the like) may be maximized in various systems.

Due to the improved degree of isolation characteristic, even when an error in operation of two power amplifiers occurs, mutual interference is small, and thus, the effects on a combination of power components may be reduced to a minimum, and the effects of oscillation, which is a measure of the instability of a power amplifier, may be reduced to a minimum.

The ultra-high frequency power combiner according to an embodiment of the disclosure includes the first and second series capacitors C1a and C1b in order to compensate for the parasitic parameters of the connection line connecting the resistor R to the first node A and the second node B. Although the first and second series capacitors C1a and C1b are added, when an impedance of the resistance end does not approach the ideal value in each analysis, a resistance value of the resistor may be adjusted. In order to improve the performance of a degree of isolation, the ultra-high frequency power combiner according to an embodiment of the disclosure may further include the first and second parallel capacitors C2a and C2b and the inductor L1 connected in parallel with the resistor R. The first and second parallel capacitors C2a and C2b and the inductor L1 may be configured by utilizing a metal strip of a layer of a multi-layer line that may be used in the MMIC chip. The connection line generates, as a parasitic parameter, a parallel capacitor in addition to a series capacitor, and thus, a width of the connection line may be designed to be as small as possible in order to minimize a parasitic capacitance value.

In the disclosure, for example, the first and second series capacitors C1a and C1b are each designed to be 0.02 pF in an arbitrarily set 80 GHz band, but when a required capacitance value decreases as an operating frequency increases, a required capacitance value may be implemented by connecting capacitors in series.

In addition to a power combiner, the disclosure may be applied in the same structure to a power divider, and thus, the overall power amplifier performance may be improved.

According to the ultra-high frequency power combiner of the disclosure, a degree of isolation between two power amplifiers connected to a first input port and a second input port is increased, and insertion loss is decreased. This may contribute to improving the performance of a power amplifier IC. In detail, because the insertion loss is decreased, maximum output power of the power amplifier IC is increased, and because the degree of isolation is increased, the effects between the two power amplifiers are decreased, and thus, a stable power amplifier IC may be designed. As such, the performance of the power amplifier IC itself is improved, thereby enabling a significant contribution to improvement in system performance in various areas such as a communication area or a radar area in which the power amplifier IC may be utilized.

Although the examples of the disclosure have been disclosed for illustrative purposes, one of ordinary skill in the art will appreciate that diverse variations and modifications are possible, without departing from the spirit and scope of the disclosure. Thus, the above embodiments of the disclosure should be understood not to be restrictive but to be illustrative, in all aspects. For example, respective constituent elements described in an integrated form may be dividedly used, and the divided constituent elements may be used in a state of being combined.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. An ultra-high frequency power combiner comprising:
   a first input line connected to a first input port;
   a second input line connected to a second input port;
   an output line connected to an output port;
   a first transmission line between the first input line and the output line;
   a second transmission line between the second input line and the output line;
   a first series capacitor, a resistor, and a second series capacitor connected in series between a first node between the first input line and the first transmission line and a second node between the second input line and the second transmission line;
   a first parallel capacitor, an inductor, and a second parallel capacitor connected in a series arrangement with one another, the series arrangement being connected in parallel with the resistor; and
   a first metal strip including at least a portion overlapping with the first node and connected with the resistor;
   a second metal strip including at least a portion overlapping with the second node and connected with the resistor;
   a third metal strip including a first portion overlapping with the first metal strip and a second portion overlapping with the second metal strip and having an inductance of the inductor; and
   an insulating layer arranged between the first and second metal strips and the third metal strip.

2. The ultra-high frequency power combiner of claim 1, wherein the resistor is 38Ω.

3. The ultra-high frequency power combiner of claim 1, wherein the first and second series capacitors are each 0.02 pF, the first and second parallel capacitors are each 0.03 pF, the inductor is 0.04 nH, and an operating frequency is 80 GHz.

4. The ultra-high frequency power combiner of claim 1, further comprising an insulating layer arranged between the first and second nodes and the first and second metal strips.

5. An ultra-high frequency power divider comprising:
   an input line connected to an input port;
   a first output line connected to a first output port;
   a second output line connected to a second output port;
   a first transmission line between the input line and the first output line;
   a second transmission line between the input line and the second output line;
   a first series capacitor, a resistor, and a second series capacitor connected in series between a first node between the first transmission line and the first output line and a second node between the second transmission line and the second output line;
   a first parallel capacitor, an inductor, and a second parallel capacitor connected in a series arrangement with one another, the series arrangement being connected in parallel with the resistor; and
   a first metal strip including at least a portion overlapping with the first node and connected with the resistor;
   a second metal strip including at least a portion overlapping with the second node and connected with the resistor;
   a third metal strip including a first portion overlapping with the first metal strip and a second portion overlapping with the second metal strip and having an inductance of the inductor; and
   an insulating layer arranged between the first and second metal strips and the third metal strip.

6. The ultra-high frequency power divider of claim 5, wherein the resistor is 38Ω.

7. The ultra-high frequency power divider of claim 5, wherein the first and second series capacitors are each 0.02 pF, the first and second parallel capacitors are each 0.03 pF, the inductor is 0.04 nH, and an operating frequency is 80 GHz.

8. The ultra-high frequency power divider of claim 5, further comprising an insulating layer arranged between the first and second nodes and the first and second metal strips.

* * * * *